United States Patent [19]
Yano

[11] Patent Number: 5,138,415
[45] Date of Patent: Aug. 11, 1992

[54] PHOTO-SEMICONDUCTOR DEVICE WITH A ZERO-CROSS FUNCTION

[75] Inventor: Shinjiro Yano, Yokohama, Japan

[73] Assignee: Kabushiki Kaisha Toshiba, Kanagawa, Japan

[21] Appl. No.: 536,563

[22] PCT Filed: Nov. 7, 1989

[86] PCT No.: PCT/JP89/01139

§ 371 Date: Jul. 5, 1990

§ 102(e) Date: Jul. 5, 1990

[87] PCT Pub. No.: WO90/05383

PCT Pub. Date: May 17, 1990

[30] Foreign Application Priority Data

Nov. 7, 1988 [JP] Japan .................. 63-280931

[51] Int. Cl.$^5$ .................. H01L 27/14; H01L 29/90; H01L 29/74
[52] U.S. Cl. .................. 357/30; 357/13; 357/38; 357/51
[58] Field of Search .................. 357/300, 30 D, 30 G, 357/30 P, 30 Q, 13, 38, 51

[56] References Cited

U.S. PATENT DOCUMENTS

| | | | |
|---|---|---|---|
| 4,224,634 | 9/1980 | Svedberg | 357/300 |
| 4,295,058 | 10/1981 | Lade et al. | 357/300 |
| 4,396,932 | 8/1983 | Alonas et al. | |
| 4,779,126 | 10/1988 | Herman | |

FOREIGN PATENT DOCUMENTS

| | | |
|---|---|---|
| 59-151463 | 8/1959 | Japan. |
| 57-18358 | 1/1982 | Japan. |
| 57-37873 | 3/1982 | Japan. |
| 58-105572 | 6/1983 | Japan. |
| 60-35571 | 2/1985 | Japan. |

*Primary Examiner*—Andrew J. James
*Assistant Examiner*—Ngan Van Ngo
*Attorney, Agent, or Firm*—Finnegan, Henderson, Farabow, Garrett and Dunner

[57] ABSTRACT

A photo-semiconductor device with a zero-cross function comprises a photo-trigger thyristor (11) which is controlled by an optical trigger signal, a MOSFET (13), and a Zener diode (14) formed in a monolithic manner in the same semiconductor substrate (16). A current path between the source and drain of the MOSFET (13) is connected between the gate and cathode of the photo-trigger thyristor (11) This MOSFET (13) is provided to control the gate sensitivity of the photo-trigger thyristor (11). The Zener diode (14) has its anode connected to the cathode of the photo-trigger thyristor (11) and its cathode connected to the gate of the MOSFET (13). This Zener diode (14) protects a gate insulating film (19) of the MOSFET (13) from dielectric breakdown. A light receiving portion (37) is provided in the Zener diode (14) and serves as a photodiode when the optical trigger signal is applied thereto. A photoelectric current generated in the Zener diode (14) by application of the optical trigger signal flows into the cathode of the photo-trigger thyristor (11) from the gate of the MOSFET (13), thereby suppressing the build-up of the gate voltage of the MOSFET (14).

13 Claims, 6 Drawing Sheets

PHOTO-SEMICONDUCTOR DEVICE WITH A ZERO-CROSS FUNCTION

TECHNICAL FIELD

The present invention relates to a photo-semiconductor device with a zero-cross function, in which a photo-trigger thyristor (including a photo-trigger triac, etc.) to be driven by an optical trigger signal, a MOS field effect transistor (hereinafter referred to as MOSFET) for controlling the gate sensitivity of the photo-trigger thyristor and a Zener diode for protecting a gate oxidized film of the MOSFET, are all formed monolithic in the same semiconductor substrate.

BACKGROUND ART

Recently, photo-trigger thyristors having a built-in zero-cross circuit using a MOSFET are widely used as an ON/OFF switching element for AC control for use in an home electric appliance, an electronic copying machine or the like. Such a photo-semiconductor device is disclosed in, for example, Published Unexamined Japanese Patent Application No. 59-151463 and its corresponding U.S. patent application Ser. No. 451,792, and U.S. patent application Ser. No. 555,025.

Figure 1:
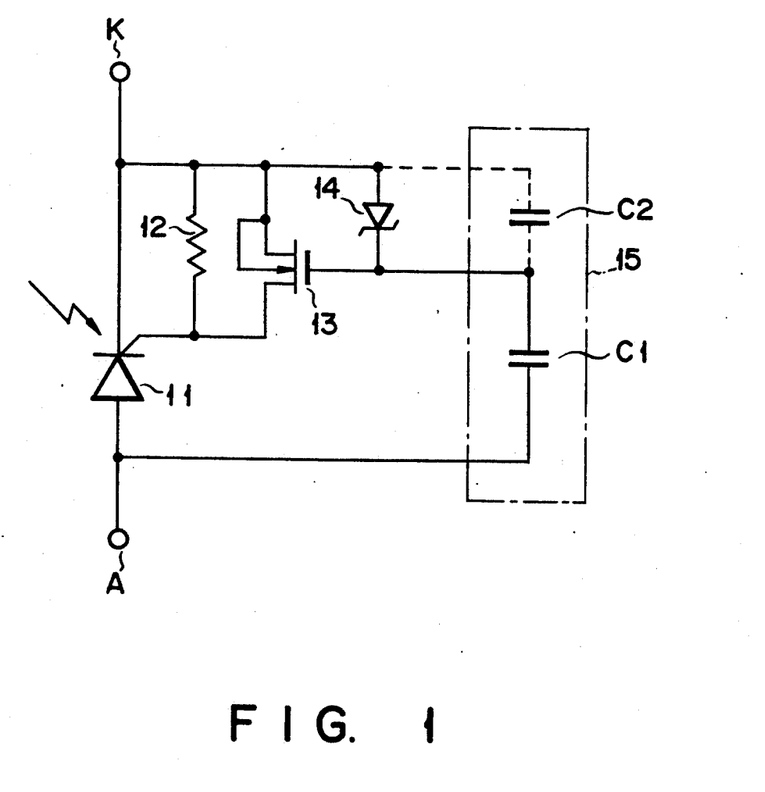
FIG. 1 is a diagram illustrating a general equivalent circuit of a photo-trigger thyristor with a zero-cross function.

FIG. 1 is a general equivalent circuit of a photo-trigger thyristor with a zero-cross function. A photo-trigger thyristor 11 is ignited by an optical trigger signal. A resistor 12 is connected between the gate and cathode K of the photo-trigger thyristor 11. A current path between the source and drain of a MOSFET 13 is connected in parallel to the resistor 12, or is connected between the gate and cathode K of the thyristor 11. The MOSFET 13 has its back gate connected to the cathode K. A Zener diode 14 has its anode connected to the cathode K and its cathode connected to the gate of the MOSFET 13. A voltage pickup circuit 15 comprising capacitors C1 and C2 serves to apply to the gate of the MOSFET 13 a gate bias voltage corresponding to a voltage applied between the anode A and cathode K of the thyristor 11, and this function is equivalently represented by the capacitors C1 and C2. The capacitor C1 has its one electrode connected to the anode A of the thyristor 11, and the other electrode connected to one electrode of the capacitor C2 and the gate of the MOSFET 13. The other electrode of the capacitor C2 is connected to the cathode K. The capacitor C1 is the capacitance of a PN junction formed to pick up a voltage between the anode A and cathode K of the thyristor 11. The capacitor C2 is the combined capacitance of the capacitance of the depletion layer of the PN junction of the Zener diode 14 and the gate capacitance of the MOSFET 13, i.e., it equivalently represents a parasitic capacitance.

A gate current generated by an optical trigger signal supplied to the gate of the photo-trigger thyristor 11 has a smaller value as compared with the gate trigger current of an ordinary thyristor, so that the thyristor 11 is required to have a high gate sensitivity. With the photo-trigger thyristor 11 designed to have a high gate sensitivity, however, the dV/dt withstandability decreases. Like this, the gate sensitivity and the dV/dt withstandability have a trade-off relation. Accordingly, the MOSFET 13 for controlling the gate sensitivity is provided to improve the relation between the gate sensitivity and the dV/dt withstandability so as to prevent the dV/dt withstandability even for the thyristor 11 with a high gate sensitivity from decreasing.

The MOSFET 13 is in an OFF state when the gate voltage is less than the threshold voltage Vth of the MOSFET 13, and the photo-trigger thyristor 11 can operate with its original high gate sensitivity, i.e., it can be turned on by a minute current such as an optical trigger signal current. When the gate voltage becomes equal to or greater than the threshold voltage Vth, the MOSFET 13 is turned on and the gate and cathode K of the photo-trigger thyristor 11 are short-circuited. With the MOSFET 13 rendered on, the thyristor 11 produces the same effect as a thyristor with the cathode and emitter short-circuited. This reduces the gate sensitivity of the photo-trigger thyristor 11 s that it will not be turned on by a minute optical trigger signal current, thus improving the dV/dt withstandability. In order to perform the above-described operation, the gate of the MOSFET 13 is applied with a voltage proportional to the anode-cathode voltage VAK of the thyristor 11 from the voltage pickup circuit 15. Assuming that the gate voltage of the MOSFET 13 reaches the threshold voltage Vth (=3 V) when the AC voltage VAK becomes 5 V, this photo-trigger thyristor 11 is turned on when given an optical trigger signal current during a phase at which VAK is 0 to 5 V, but is not turned on even when given the optical trigger signal current at the phase of VAK exceeding 5 V. A thyristor whose trigger function works in a specific voltage range at the proximity where an AC voltage applied to the main electrodes (anode and cathode) of the thyristor crosses a voltage of 0 V (the range will be hereinafter referred to as zero-cross portion., 0 to 5 V in the above example) is called a zero-cross type thyristor. A circuit comprising a MOSFET, etc. for providing a zero-cross function is called a zero-cross circuit.

The zero-cross type thyristor has the following two main effects. First, in performing the ON/OFF control of AC power of an commercially available frequency by a thyristor which is not of a zero-cross type, when the thyristor is turned on at the phase of a high value AC voltage (depending on a load), noise generally occurs due to by a rush current or a transient voltage. This would cause a malfunction of an LSI circuit, an IC logic circuit, etc. provided near the thyristor or give an electromagnetic trouble, such as a radio or TV noise problem to electronic appliances. The zero-cross circuit has an effect to significantly suppress the electromagnetic trouble. The second effect is such that with a thyristor designed to have a high gate sensitivity, the high gate sensitivity is given only when the AC voltage VAK is at the phase of the zero-cross portion, and the thyristor has a so-called cathode-emitter short-circuit structure at other phases to thereby significantly reduce the gate sensitivity. As a result, the dV/dt withstandability is improved.

The Zener diode 14 is provided to protect the gate insulating film of the MOSFET 13. This is because the thickness of the gate insulating film of the MOSFET 13 is determined mainly by the desired threshold voltage Vth and cannot be set sufficiently thick to prevent the dielectric breakdown. In other words, the diode 14 having a Zener voltage smaller than the dielectric breakdown voltage of the gate insulating film is provided between the gate of the MOSFET 13 and the cathode K of the thyristor 11, so that when an abnormal voltage exceeding the Zener voltage is applied, it is broken down to be led to the cathode K.

The output voltage of the voltage pickup circuit 15 (voltage at the common node between the capacitors C1 and C2) is substantially equal to the reciprocal ratio of the capacitors C1 and C2 with respect to the anode-cathode voltage VAK of the thyristor 11. When the voltage VAK is small, the capacitance of the depletion layer at the PN junction of the capacitor C1 is very large, and the gate voltage of the MOSFET 13 is substantially equal to the voltage VAK. This gate voltage (the same as the output voltage of the voltage pickup circuit 15) will hereinafter be denoted by VP.

In the above-described zero-cross type photo-trigger thyristor 11 exists a specific characteristic representing the build-up rate dVAK/dt of the maximum anode-cathode voltage VAK for the photo-trigger thyristor 11 to be turned on at the zero-cross portion (this characteristic will be hereinafter called "dV/dt ON characteristic"). When the build-up rate of the anode-cathode voltage VAK becomes equal to or greater than the value of this dV/dt ON characteristic, the gate voltage VP of the MOSFET 13 reaches the threshold voltage Vth before the photo-trigger thyristor 11 becomes completely on, i.e., before the conducting current reaches a latching current, thus turning on the MOSFET 13. Consequently, the photo-trigger thyristor 11 cannot be turned on a minute gate current such as an optical trigger signal current. Such a dV/dt ON characteristic has a strong correction with the voltage VAK (hereinafter called "voltage VW"), at which the MOSFET 13 starts being driven and which is determined by Vth of the MOSFET 13 or VP/VAK or the like. Accordingly, the dV/dt ON characteristic has a trade-off relation with the dV/dt withstandability, one of the basic characteristics of a thyristor. Conventionally, therefore, if the voltage VW is increased to improve the dV/dt ON characteristic, the dV/dt withstandability tends to decrease, and when the voltage VW is reduced to improve the dV/dt withstandability, the dV/dt ON characteristic decreases.

As described above, in a zero-cross type photo-trigger thyristor exists a specific characteristic representing the maximum VAK voltage build-up rate for the photo-trigger thyristor to be turned on at the zero-cross portion, i.e., the dV/dt ON characteristic. It is desirable that the value of the dV/dt ON characteristic be as large as possible, and the voltage VW is wanted to be larger. In contrast, in order to improve the dV/dt withstandability of the photo-trigger thyristor, it is desirable to turn on the MOSFET by as small a voltage VAK as possible with a contradictory request to make the value of the dV/dt ON characteristic smaller. Conventionally, however, it is difficult to satisfy both a large value of the dV/dt ON characteristic and a high dV/dt withstandability.

Accordingly, it is an object of the present invention to provide a photo semiconductor device with a structure which can improve the dV/dt ON characteristic without reducing the dV/dt withstandability in a photo-trigger thyristor having a zero-cross circuit using a MOSFET.

DISCLOSURE OF THE INVENTION

A photo-semiconductor device of the present invention having a zero-cross function in which a photo-semiconductor element whose ON/OFF state is controlled by an optical trigger signal, a MOSFET having a current path between its source and drain connected between a control electrode and a first main electrode of the photo-semiconductor element and having a gate applied with a bias voltage corresponding to a voltage applied between the first main electrode and a second main electrode of the photo-semiconductor element to thereby serve as a zero-cross circuit, and a Zener diode, having an anode connected to the first electrode of the photo-semiconductor element and a cathode connected to the gate electrode of the MOSFET, for protecting the MOSFET are formed in monolithic manner, characterized in that the Zener diode has a light receiving portion for receiving the optical trigger signal so that when the optical trigger signal is applied on the light receiving portion, the Zener diode serves as a photodiode and permits a photoelectric current generated by the applying of the optical trigger signal to flow through the first main electrode of the photo-semiconductor element from the gate of the MOSFET to thereby suppress build-up of the gate bias voltage of the MOSFET.

In the zero-cross type photo-semiconductor device with the above structure, providing the light receiving portion to the Zener diode, which has been used only to protect the gate insulating film of the MOSFET, permits an optical trigger signal to be received at the proximity of the PN junction of the Zener diode. Accordingly, the Zener diode also serves as a photodiode and a photoelectric current is generated at the time of applying an optical trigger signal. This photoelectric current passes inside the Zener diode and flows toward the first main electrode (cathode) of the photo-semiconductor device. This current serves to suppress the build-up of the gate voltage of the MOSFET, making it possible to increase the voltage VAK at the time the gate voltage reaches the threshold voltage Vth, i.e., the voltage VW. When the optical trigger signal is not applied, the photoelectric current does not flow and the voltage VW does not change, thus maintaining the dV/dt withstandability at a high level.

Accordingly, it is possible to improve the dV/dt ON characteristic, which is a characteristic at the time of applying trigger light, without reducing the dV/dt withstandability, a characteristic at the time no trigger light is applied.

BEST MODES OF CARRYING OUT THE INVENTION

This invention will now be described referring to the accompanying drawings.

Figure 2:
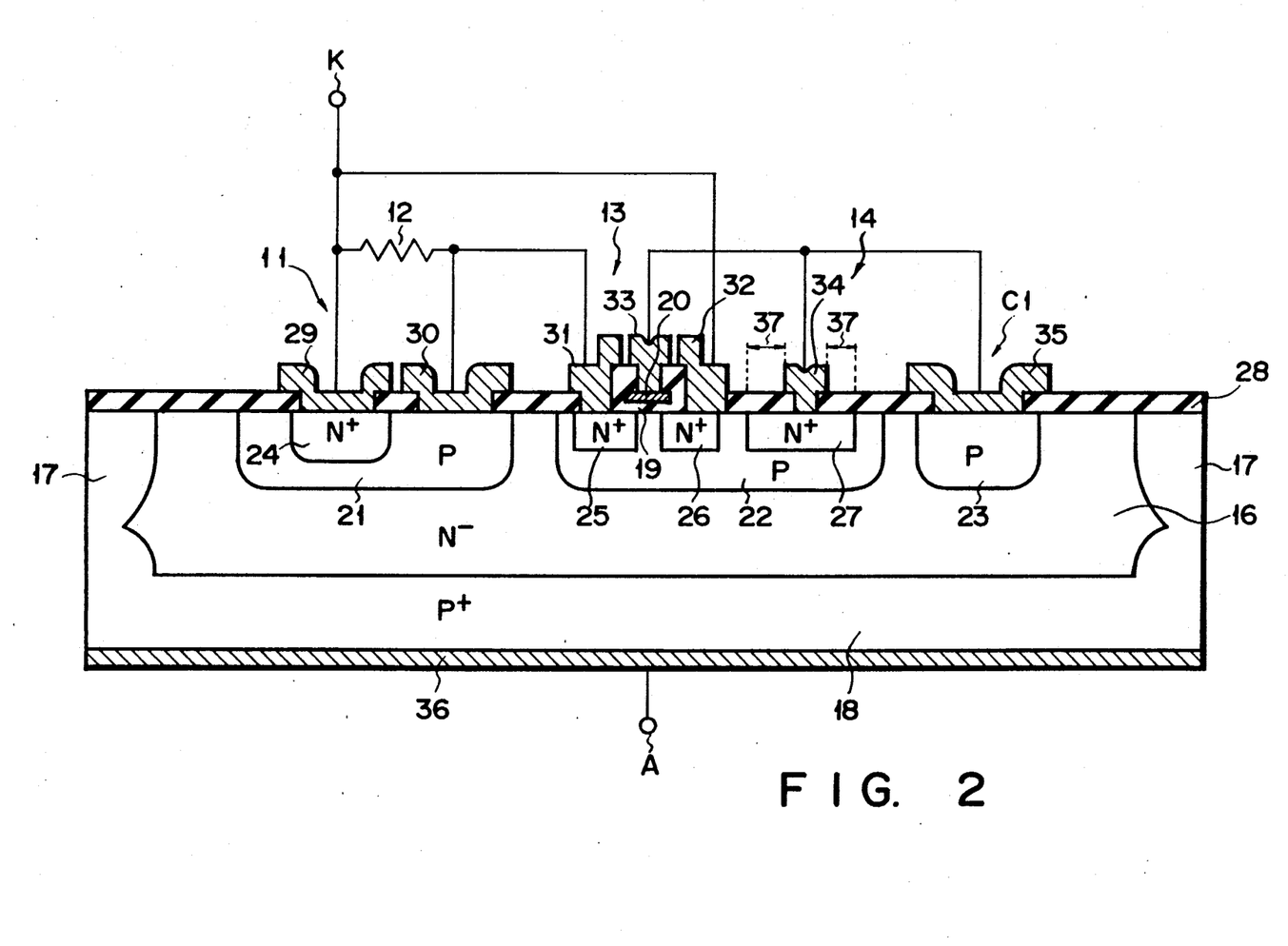
FIG. 2 is a cross section exemplifying the structure of the first embodiment of a photo-semiconductor device of the present invention.

FIG. 2 illustrates the first embodiment of a photo-semiconductor device of the present invention, which has a zero-cross function. This photo-semiconductor device, basically represented by an equivalent circuit shown in FIG. 1, is a compound photo-trigger thyristor, which comprises a photo-trigger type thyristor 11, a MOSFET 13 for controlling the gate sensitivity of the thyristor 11, and a Zener diode 14 for protecting the gate insulating film of the MOSFET 13.

The outline of manufacturing processes of the device will now be given with an explanation of the structure thereof. First, a P type impurity is selectively introduced in an N− type silicon substrate 16 with a specific resistance of approximately 40 Ω.cm to form an element isolation region 17 and an anode region 18 (also called a P+ emitter region). The element isolation region 17 is formed surrounding the region where the compound photo-trigger thyristor is to be formed a the P type impurity is introduced from the major surface and bottom surface of the substrate 16. The anode region 18 is formed on the bottom surface of the substrate 16. In fabricating the thyristor 11 with a withstand voltage of about 600 V, for example, the substrate 16 in use should be 240 μm thick and the anode region 18 would be formed at the diffusion depth of about 100 μm. Then, the major surface of the substrate 16 is thermally-oxidized to form an oxide film. A photoresist is coated on this oxide film, which is in turn patterned by a photo-etching method. Accordingly, openings are formed in a region where the P base of the photo-trigger thyristor 11 is to be formed, a region where a P-well for forming the MOSFET 13 and the Zener diode 14 is to be formed, and a region where a P type impurity region for forming a capacitor Cl is to be formed. Subsequently, the exposed part of the substrate 16 for the P-well forming region is thermally oxidized so as to form a gate insulating film 19 (about 1000 Å thick) of the MOSFET 13. A gate electrode 20 of the MOSFET 13, which is formed of undoped polysilicon, is formed on the gate insulating film 19. After boron (B) is ion-implanted in the major surface of the substrate 16, drive-in diffusion is performed to thereby form a P base region 21 of the photo-trigger thyristor 11 with a diffusion depth of about 25 μm, a P-well region 22 for forming the MOSFET 13 and the Zener diode 14, and a P type impurity region (a voltage picking-up portion) 23. Also, an impurity is introduced into the undoped polysilicon gate electrode 20 in this process, and the resistance is reduced. Then, an N type impurity is selectively ion-implanted from the surface of the P base region 21, which results in depositing an N+ emitter region 24 with a diffusion depth of approximately 10 μm. This N+ emitter region 24 becomes a cathode region for the photo-trigger thyristor 11. Then, an N type impurity is selectively ion-implanted in the surface region of the P-well region 22 to form an N+ drain region 25 and an N+ source region 26 of the MOSFET 13, and an N+ impurity region 27 of the Zener diode 14, at predetermined intervals at a diffusion depth of about 5 μm. An oxide film 28 is formed on the whole major surface of the substrate 16, and contact holes for connecting all the electrodes are formed in the oxide film 28. Thereafter, a metal layer, such as an aluminum layer, which serves as an electrode, is vapor-deposited on the entire surface, and is subjected to patterning. As a result, a cathode electrode 29 and a gate electrode 30 of the photo-trigger thyristor 11, a drain electrode 31, a source electrode 32 and a gate electrode wiring 33 of the MOSFET 13, an electrode 34, and an electrode 35 of the voltage pickup section are formed. Likewise, an anode electrode 36 made of gold or the like is formed on the bottom substrate 16. The source electrode 32 is formed over the P well region 22 and the source region 26 to contact them. Further, the electrode 34 of the Zener diode 14 is formed on that portion of the oxide film 28 above the N+ impurity region 27 in such a way as not fully cover the region 27. A regions 37, which is above the N+ impurity region 27 and is not covered with the electrode 34, serves as a light receiving portion for receiving an optical trigger signal.

The anode electrode 36 of the thyristor 11 is connected to an anode terminal A, and the cathode electrode 29 to a cathode terminal K. A resister 12 is connected between the cathode electrode 29 and the gate electrode 30, and it is formed of a polysilicon layer formed on the substrate 16 via an insulation film. The drain electrode 31 of the MOSFET 13 is connected to one end of the resistor 12 and the gate electrode 30 The source electrode 32 is connected to the cathode terminal K. The gate electrode wiring 33 of the MOSFET 13, the electrode 34 of the Zener diode 14, and the electrode 35 of the capacitor Cl are connected together.

Figure 3A:
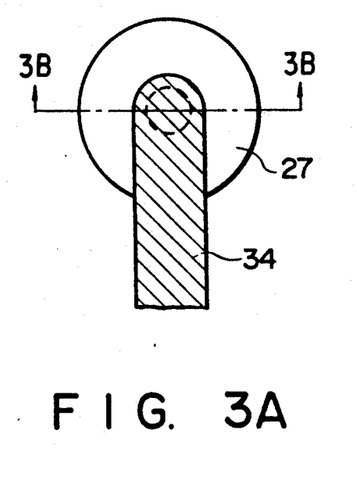
FIG. 3A is an enlarged pattern plan view illustrating the structure of a Zener diode in the photo-semiconductor device in FIG. 2.
Figure 3B:
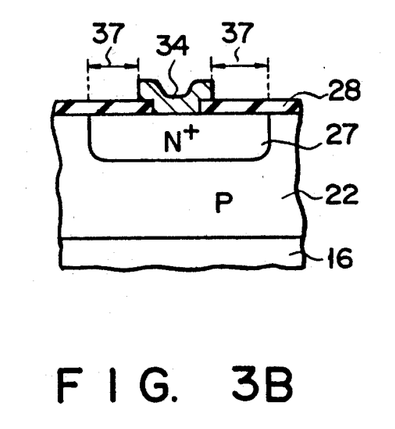
FIG. 3B is a cross section of the structure along the X—X' line in FIG. 3A.
Figure 4A:
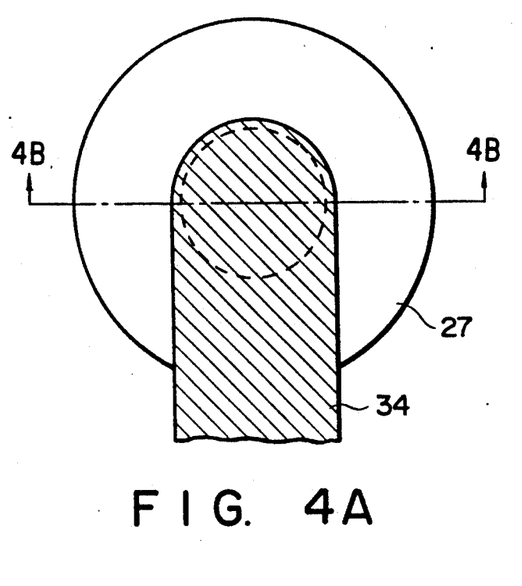
FIG. 4A is a pattern plan view illustrating another structure of the Zener diode in the photo semiconductor device shown in FIG. 2.
Figure 4B:
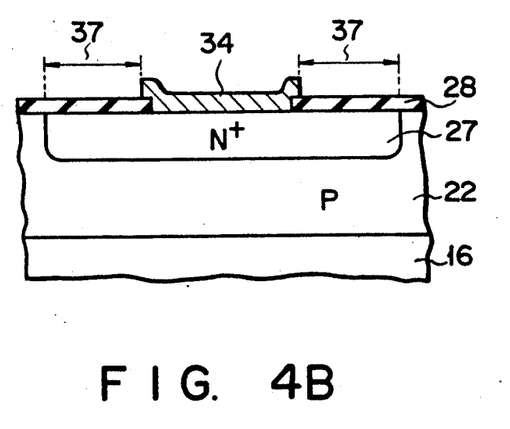
FIG. 4B is a cross section of the structure along the Y—Y' line in FIG. 4A.

The main feature of the photo-semiconductor device shown in the above embodiment lies in the structure of the Zener diode 14. The Zener diode 14 is provided with the light receiving portion 37 to receive an optical trigger signal for triggering the photo-trigger thyristor 11. FIG. 3A is an enlarged pattern plan view illustrating the structure of the Zener diode 14 shown in FIG. 2, and FIG. 3B is a cross section of the structure along the line X—X' in FIG. 3A. The electrode 34 is reduced to the minimum size not to influence the value of a current which flows at the time of break-down, and the light receiving portion 37 for receiving an optical trigger signal is formed at the proximity of the PN junction formed by the N+ impurity region 27 and the P-well region 22. When the optical trigger signal is applied to the thyristor 11, this light is received by the light receiving portion 37. It is preferable that, as shown in FIGS. 4A and 4B, the Zener diode 14 should have a structure to increase the N+ impurity region 27 to such a size as not to greatly influence the build-up rate of the output voltage (VP) of the voltage pickup circuit 15 by extremely increasing the capacitance of the PN junction, thereby providing a sufficient photoelectric current.

The operations of the zero-cross type photo-semiconductor device with the above structure will now be described. Since the basic operations and actions of the MOSFET 13, the Zener diode 14, and voltage pickup circuit 15 are the same a those of the above-described equivalent circuit in FIG. 1, the detailed description will be given paying attention to the operation and action at the time an optical trigger signal is applied to the Zener diode 14, which is the main characteristic of the present invention.

Figure 5:
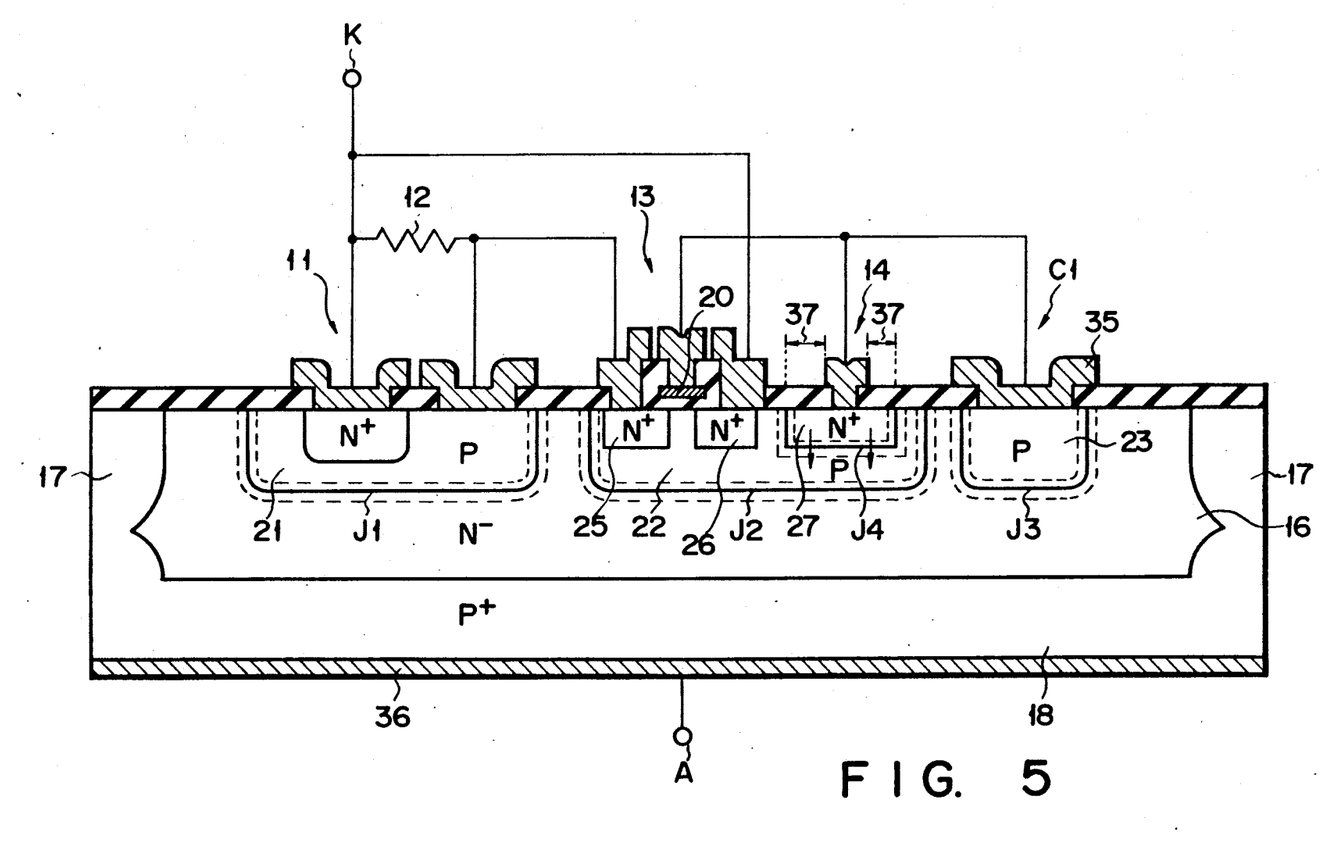
FIG. 5 is a cross section of the photo-semiconductor device shown in FIG. 2 for explaining its action.

When the forward bias voltage VAK is applied between the anode terminal A and the cathode terminal K of the photo trigger thyristor 16, a junction J1 between the P base region 21 and the N⁻ type substrate 16, a junction J2 between the P-well region 22 and the substrate 16, and a junction J3 between the P type impurity region 23 of the voltage pickup section and the substrate 16 are reverse-biased, so that depletion layers as indicated by broken lines are formed, as shown in FIG. 5. Since the N⁺ impurity region 27 of the Zener diode 14 is at a positive potential with respect to the P-well region 22, due to combining of the capacitances by the depletion layer formed at the junction J3, a depletion layer is also formed at a junction J4 of the Zener diode 14. The electrode 35 of the voltage pickup section is electrically connected to the anode terminal A via the capacitance of the depletion layer at the junction J3, and to the cathode terminal K via the capacitances of the depletion layer at the junction J4 and the static capacitance or the like of the gate electrode 20 of the MOSFET 13 and the N⁺ source region 25. If the voltage VAK between the anode terminal A and the cathode terminal K is low within the range of the zero-cross portion, the voltage VP of the electrode 35 of the voltage pickup section takes a value close to the voltage VAK, and increases in proportion to the voltage VAK. (The voltage VP is however saturated when the voltage VAK becomes large and the depletion layers of the junctions J2 and J3 become close to each other.)

When the trigger light is irradiated and received at the light receiving portion 37, a photoelectric current flows in the Zener diode 14 in the direction of the arrowhead from the N⁺ impurity region 27 to the P-well region 22. This photoelectric current serves to leak the charges accumulated in the static capacitor between the gate electrode 20 and the N⁺ source region 26 of the MOSFET 13 so as to suppress the build-up of the voltage VP applied to the gate of the MOSFET 13. This may be considered as the irradiation of light causing a resistor to be equivalently connected in parallel between the electrode 35 and cathode of the voltage pickup section, so that the rate of picking up the voltage VAK (VP/VAK) is reduced.

Therefore, the anode-cathode voltage VAK at the time the gate voltage of the MOSFET 13 reaches the threshold voltage Vth, i.e., the voltage VW becomes larger in a case where light is irradiated as compared with a case where no light is irradiated. This can improve the dV/dt ON characteristic, which becomes important at the time of irradiating the trigger light, without changing the dV/dt withstandability which is important in a case where no trigger light is irradiated.

The present inventor measured the dV/dt ON characteristic of the semiconductor device with the light receiving portion 37 provided at the junction of the Zener diode 14 (shown in FIG. 2), from differential waveforms of the voltage VAK, and confirmed that the dV/dt ON characteristic was improved 10% as compared with the conventional device without the light receiving portion.

To improve this effect, it is necessary to increase the area of the junction J4 of the Zener diode 14 as much as possible and make such a design as to facilitate the depletion layer extending at the junction J4. In this case, the capacitance of the Zener diode 14 may change to alter the division of the capacitance by the capacitance of the junction J3 of the voltage pickup section, the gate parasitic capacitance of the MOSFET 13 and the capacitance of the Zener diode 14, resulting in a change in the ratio of the voltage VP of the voltage pickup section to the anode-cathode voltage VAK, VP/VAK. However, such a variation can be suppressed to the minimum by controlling the capacitances of the voltage pickup section and the electrode 20 of the MOSFET 13.

Figure 6:
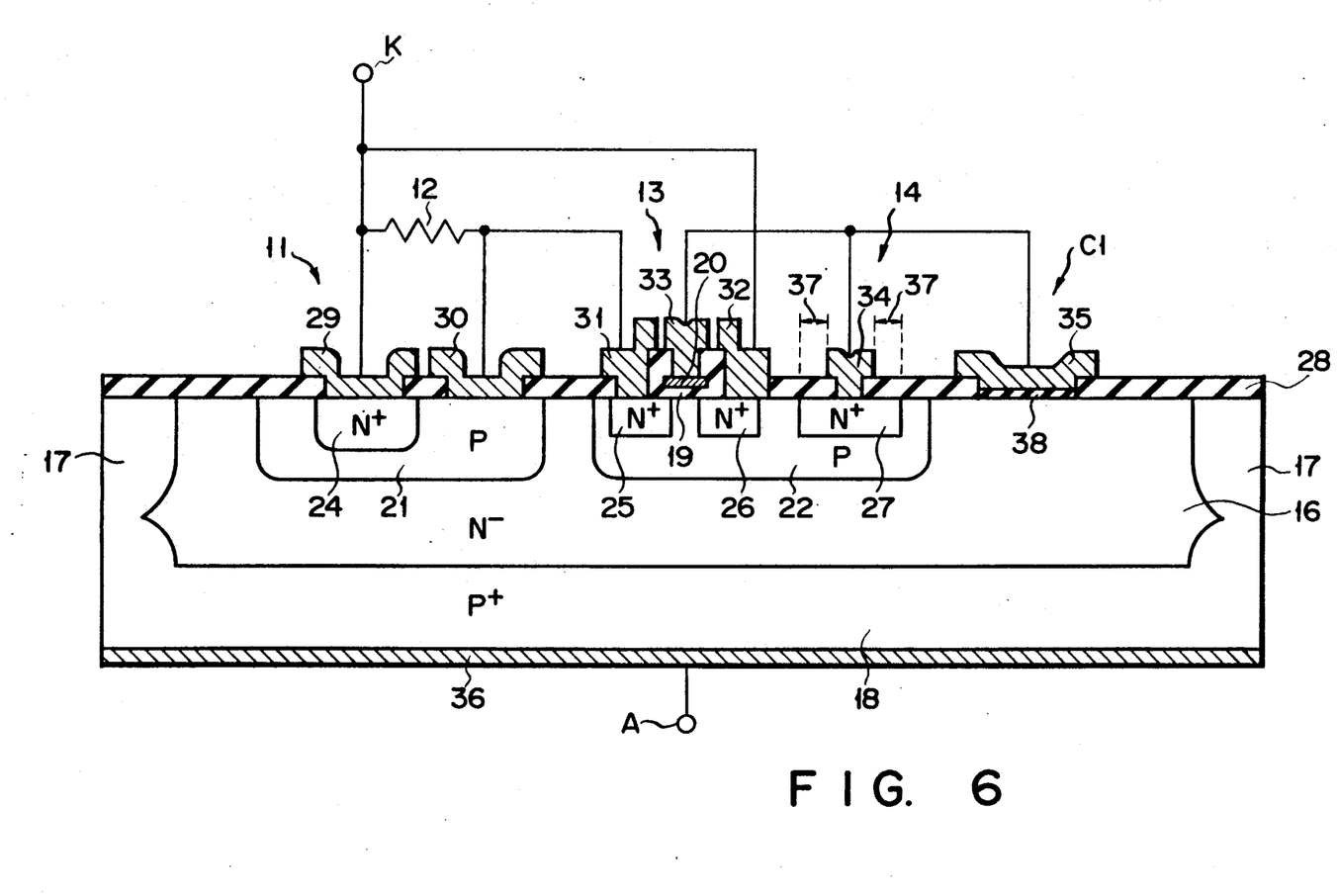
FIG. 6 is a cross section exemplifying the structure of the second embodiment of a photo-semiconductor device of the present invention.

In the aforementioned first embodiment, the P type impurity region 22 is to supply the bias voltage corresponding to the voltage applied between the anode and the cathode of the thyristor 11, to the gate of the MOSFET 13. Alternately, an electrode 35 may be provided on the substrate 16 through an insulating film 38 as shown in FIG. 6. The same reference numerals as used in FIG. 2 are given to the identical structural elements in FIG. 6, and their detailed description will be omitted.

This structure can basically perform the same operation as the first embodiment and can provide the same effect.

Although the voltage pickup section is formed i the same semiconductor substrate in the first and second embodiments, a voltage dividing circuit, which comprises a static capacitor and divides the voltage between the anode and cathode of the thyristor 11 may instead be provided externally.

Further, although the foregoing description of the above embodiments has been given with reference to a photo-trigger thyristor as an example, this invention may be applied to other photo-semiconductor devices, such as a reverse-flow preventing, three-terminal thyristor and a triac, which have three or more PN junctions, and have two stable states, on and off, in at least one quadrant of the main voltage-current characteristic, as long as the switching the photo-semiconductor devices to the ON state from the OFF state can be executed an optical trigger signal.

Figure 7:
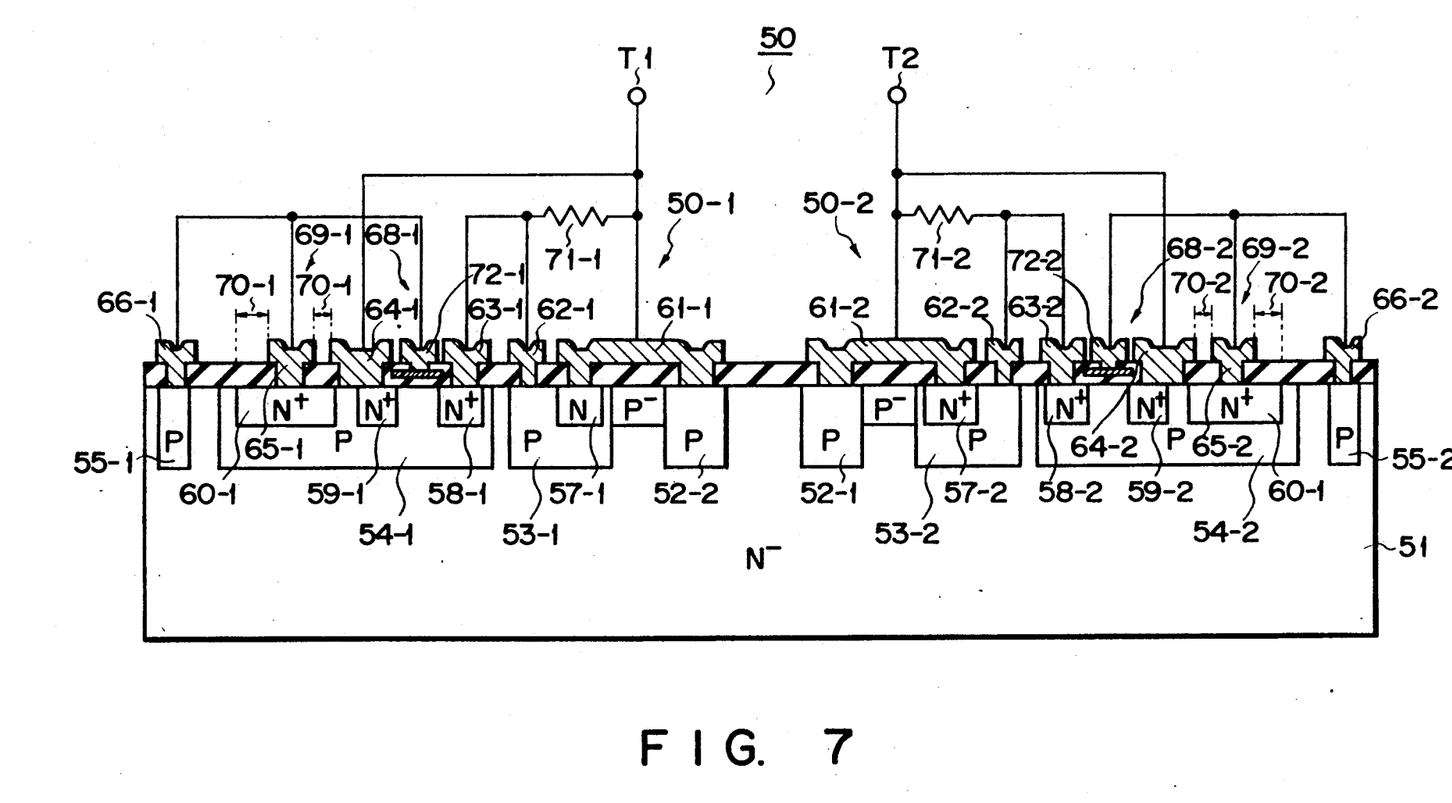
FIG. 7 is a cross section exemplifying the structure of the third embodiment of a photo-semiconductor device of the present invention.

FIG. 7 illustrates the cross-sectional structure of the third embodiment of a photo-semiconductor device according to the present invention as applied to a lateral photo-trigger triac. In this figure, a photo trigger triac 50 has first and second photo-trigger thyristors 50-1 and 50-2 with a PNPN structure formed in an almost laterally symmetrical manner in an N⁻ type silicon substrate 51, partially overlapping each other and connected in parallel in the reverse direction. A first PNPN structure (first photo-trigger thyristor 50-1) is formed by a P base region 53-1 formed in the major surface region of the substrate 51, an N emitter region 57-1 selectively formed in this region 53-1, the substrate 51 as an N⁻ base region and a P emitter region 52-1. A first main electrode 61-1 is formed in an ohmic contact with the N emitter region 57-1 and the P emitter region 52-2 of the second thyristor 50-2. In a P-well region 54-1 are formed a first MOSFET 68-1 for controlling the gate sensitivity of the first photo-trigger thyristor 50-1, and a first Zener diode 69-1 for protecting the gate insulating film of this MOSFET 68-1. The first Zener diode 69-1 has a light receiving portion 70-1 for receiving an optical trigger signal. In the major surface region of the substrate 51 is formed a P type impurity region 55-1 as a voltage pickup section for applying a gate bias voltage to the first MOSFET 68-1. The N⁺ source region 59-1 of the MOSFET 68-1 is connected to the N emitter layer 57-1 through the source electrode 64-1 and first main electrode 61-1. The N⁺ drain region 58-1 of the MOSFET 68-1 is connected to the P base region 53-1 through the drain electrode 63-1 and the first gate electrode 62-1 of the photo-trigger triac 50. The first main electrode 61-1 and source electrode 64-1 are connected with a first main electrode terminal T1. A resistor 71-1 is connected between the source electrode 63-1 and the first main electrode terminal T1. The gate electrode wiring 72-1 of the MOSFET 68-1, the electrode 65-1 of the Zener diode 69-1 and the electrode 66-1 of the voltage pickup section are connected together.

Likewise, a second PNPN structure (second phototrigger thyristor 50-2) is formed by a P base region 53-2 formed in the major surface region of the N⁻ type silicon substrate 51, an N emitter region 57-2 selectively formed in this region 53-2, the substrate 51 as an N⁻ base region and a P emitter region 52-2. A second main electrode 61-2 is formed in an ohmic contact with the N emitter region 57-2 and the P emitter region 52-1 of the first thyristor 50-1. In a P-well region 54-2 are formed a second MOSFET 68-2 for controlling the gate sensitivity of the second photo-trigger thyristor 50-2, and a second Zener diode 69-2 for protecting the gate insulating film of this MOSFET 68-2. The second Zener diode 69-2 has a light receiving portion 70-2 for receiving an optical trigger signal. In the major surface region of the substrate 51 is formed a P type impurity region 55-2 as a voltage pickup section for applying a gate bias voltage to the second MOSFET 68 2. The N⁺ source region 59-2 of the MOSFET 68-2 is connected to the N emitter layer 57-2 through the source electrode 64-2 and second main electrode 61-2. The N⁺ drain region 58-2 of the MOSFET 68-2 is connected to the P base region 53-2 through the drain electrode 63-2 and the second gate electrode 62-2 of the photo-trigger triac 50. The first main electrode 61-2 and source electrode 64-2 are connected with a second main electrode terminal T2. A resistor 71-2 is connected between the source electrode 63-2 and the second main electrode terminal T2. The gate electrode wiring 72- of the MOSFET 68-2, the electrode 65 2 of the Zener diode 69-2 and the electrode 66-2 of the voltage pickup section are connected together.

The feature of this embodiment lies in that the light receiving portions 70-1 and 70-2 are respectively provided on the N⁺ impurity regions 60-1 and 60-2 of the Zener diode of the photo-trigger triac. The operation and action are basically the same as those of the first and second embodiments, so that their detailed description will be omitted.

The photo-trigger triac with the above structure, like the photo-trigger thyristors of the first and second embodiments, can improve the dV/dt ON characteristic at the time of irradiating trigger light, without reducing the dV/dt withstandability, a characteristic at the time no trigger light is irradiated.

Industrial Applicability

As described above, a photo-semiconductor device with a zero-cross function according to the present invention can improve the dV/dt ON characteristic important at the time of irradiating trigger light without influencing the dV/dt withstandability by making a relatively small modification to the structure of a Zener diode portion, and this effect is significant.

I claim:

1. A photo-semiconductor device comprising:
    a photo-semiconductor element whose ON/OFF state is controlled by an optical trigger signal, the photo-semiconductor element having a control electrode, a first main electrode, and a second main electrode;
    a MOSFET serving as a zero-cross circuit, said MOSFET having a source electrode connected the first main electrode, a drain electrode connected to the control electrode, and a gate electrode applied with a bias voltage;
    a Zener diode for protecting the MOSFET, the Zener diode having an anode connected to the first main electrode and a cathode connected to the gate electrode; and
    means for guiding the optical trigger signal to the cathode of the Zener diode,
    wherein the Zener diode serves as a photo diode when the cathode receives the optical trigger signal, and prevents the bias voltage applied to the gate electrode from increasing by allowing a current generated by the optical trigger signal to flow from the gate electrode to the first main electrode.

2. A photo-semiconductor device according to claim 1, wherein the photo-semiconductor element includes a photo-trigger thyristor.

3. A photo-semiconductor device according to claim 2, wherein the photo-trigger thyristor includes a semiconductor substrate of a first conductivity type having a main surface region and a reverse surface region, a first semiconductor region of a second conductivity type formed in the main surface region of the semiconductor substrate, a second semiconductor region of the first conductivity type formed in a surface region of the first semiconductor region and having a higher impurity concentration than the semiconductor substrate, and a third semiconductor region of the second conductivity type formed in the reverse surface region of the semiconductor substrate and having a higher impurity concentration than the first semiconductor region, the control electrode being formed on the first semiconductor region, the first main electrode being formed on the second semiconductor region, and the second main electrode being formed on the third semiconductor region.

4. A photo-semiconductor device according to claim 3, wherein the MOSFET and the Zener diode are formed in a fourth semiconductor region of a second conductivity type formed in the main surface region of the semiconductor substrate, as separate from the first semiconductor region.

5. A photo-semiconductor device according to claim 4, wherein the MOSFET includes source and drain regions of a first conductivity type formed at a predetermined interval i a surface region of the fourth semiconductor region and having a higher impurity concentration than the semiconductor substrate, a gate insulating film formed on the fourth semiconductor region between the source and drain regions, and a gate electrode formed on the gate insulating film.

6. A photo-semiconductor device according to claim 5, wherein the Zener includes an impurity region of a first conductivity type formed at predetermined intervals from the source and drain regions in a surface region of the fourth semiconductor region and having a higher impurity concentration than the semiconductor substrate, and an electrode provided in an ohmic contact in the impurity region and having an area smaller than that of the impurity region, that portion on the impurity region where the electrode is not formed serving as the guiding means.

7. A photo-semiconductor device according to claim 1, further comprising bias means for applying the bias voltage, the bias voltage corresponding to a voltage applied between the first and second main electrodes of the photo-semiconductor element.

8. A photo-semiconductor device according to claim 7, wherein the bias means includes an impurity region of a second conductivity type formed in a main surface region of a semiconductor substrate of a first conductivity type, and an electrode formed on the impurity region.

9. A photo-semiconductor device according to claim 7, wherein the bias means includes an insulating layer formed on a main surface of a semiconductor substrate of a first conductivity type and an electrode formed on the insulating layer.

10. A photo-semiconductor device according to claim 1, further comprising a load element connected between the control electrode and said first main electrode of the photo-semiconductor element.

11. A photo-semiconductor device according to claim 10, wherein the load element includes a resistor.

12. A photo-semiconductor device according to claim 1, wherein the guiding means is part of the Zener diode.

13. A photo-semiconductor device comprising:

a photo-semiconductor element whose ON/OFF state is controlled by an optical trigger signal, the photo-semiconductor element having a control electrode, a first main electrode, and a second main electrode;

a MOSFET serving as a zero-cross circuit, the MOSFET having a source electrode connected to the first main electrode, a drain electrode connected to the control electrode, and a gate electrode applied with a bias voltage; and a Zener diode for protecting the MOSFET, the Zener diode having an anode connected to the first main electrode and a cathode connected to the gate electrode, the Zener diode including a light-receiving means for receiving the optical trigger signal, and serving as a photo diode when the light-receiving means receives the optical trigger signal, and the bias voltage applied to the gate electrode being prevented from increasing, with an optical current generated by the optical trigger being allowed to flow from the gate electrode to the first main electrode of the photo-semiconductor element.

* * * * *